US007326999B2

(12) United States Patent
Tsukada

(10) Patent No.: US 7,326,999 B2
(45) Date of Patent: Feb. 5, 2008

(54) CHIP RESISTOR AND METHOD FOR MANUFACTURING SAME

(75) Inventor: Torayuki Tsukada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 124 days.

(21) Appl. No.: 10/553,044

(22) PCT Filed: Apr. 16, 2004

(86) PCT No.: PCT/JP2004/005523

§ 371 (c)(1),
(2), (4) Date: Oct. 13, 2005

(87) PCT Pub. No.: WO2004/093101

PCT Pub. Date: Oct. 28, 2004

(65) Prior Publication Data

US 2006/0205171 A1 Sep. 14, 2006

(30) Foreign Application Priority Data

Apr. 16, 2003 (JP) ............................ 2003-112015

(51) Int. Cl.
*H01L 23/62* (2006.01)
*H01C 1/03* (2006.01)
*H01C 1/028* (2006.01)

(52) U.S. Cl. ....................... 257/359; 338/240; 338/251

(58) Field of Classification Search ................ 438/382, 438/383, 384; 338/309, 240, 251; 257/359
See application file for complete search history.

(56) References Cited

U.S. PATENT DOCUMENTS 5,604,477 A 2/1997 Rainer et al.
5,781,158 A * 7/1998 Ko et al. ............. 343/700 MS
6,150,920 A * 11/2000 Hashimoto et al. .......... 338/309
6,348,852 B1 * 2/2002 Kojima et al. ............ 338/22 R
6,492,896 B2 * 12/2002 Yoneda ....................... 338/309
6,690,558 B1 * 2/2004 Devoe et al. ................. 361/58
2003/0117258 A1 * 6/2003 Kim et al. .................. 338/309
2004/0262712 A1 * 12/2004 Doi ............................ 257/536

FOREIGN PATENT DOCUMENTS

| | | |
|---|---|---|
| EP | 1 028 436 | 4/1999 |
| JP | 47-27876 | 8/1972 |
| JP | 8-64401 | 3/1996 |
| JP | 8-236324 | 9/1996 |
| JP | 2000-114009 | 4/2000 |
| JP | 2000- 150210 | 5/2000 |
| JP | 2001-118701 | 4/2001 |
| JP | 2001-351803 | * 12/2001 |
| JP | 2002-57009 | 2/2002 |
| JP | 2002-57010 | 2/2002 |
| WO | WO 99/18584 | 4/1999 |

* cited by examiner

*Primary Examiner*—W. David Coleman
(74) *Attorney, Agent, or Firm*—Hamre, Schumann, Mueller & Larson, P.C.

(57) ABSTRACT

A chip resistor (R1) includes a resistor element (1) having a first surface (1*a*) and a second surface (1*b*) opposite to the first surface. Two main electrodes (21), spaced from each other, are provided on the first surface (1*a*), while two auxiliary electrodes (22), spaced from each other, are provided on the second surface (1*b*). The auxiliary electrodes face the main electrodes (21) via the resistor element (1). The main electrodes (21) and the auxiliary electrodes (22) are made of the same material.

12 Claims, 9 Drawing Sheets

CHIP RESISTOR AND METHOD FOR MANUFACTURING SAME

TECHNICAL FIELD

The present invention relates to a chip resistor and a method of making the same.

BACKGROUND ART

FIGS. 10 and 11 illustrate a conventional chip resistor. The chip resistor 1A shown in FIG. 10 is disclosed in JP-A-2002-57009, and the chip resistor 2A shown in FIG. 11 is disclosed in JP-A-2002-57010.

As shown in FIG. 10, the chip resistor 1A includes a metal resistor element 100 and a pair of copper electrodes 110. The electrodes 110 are fixed to a lower surface 100*a* of the resistor element 100 and spaced from each other in the direction X in the figure. Each of the electrodes 110 includes a lower surface provided with a solder layer 130.

The chip resistor 1A is surface-mounted on e.g. printed circuit board, using solder. It is desirable that melted solder uniformly contacts with the entire lower surface of each of the electrode 110. However, the melted solder may contact only with an inner surface 111 and its vicinity of the electrode 110. The melted solder may also contact with only an outer surface 112 of the electrode 110. The chip resistor 1A may provide different resistances in the former case and in the latter case. Thus, a circuit using the chip resistor 1A may not have a desirable electrical property depending on the soldering condition. Such disadvantage is noticeable especially in a chip resistor having a low resistance (not more than 100 mΩ for example).

The chip resistor 2A shown in FIG. 11 includes a pair of bonding pads 120 in addition to the features of the above-described chip resistor 1A. Specifically, the two bonding pads 120 are fixed to an upper surface 100*b* of the resistor element 100 and spaced from each other in the direction X. As shown, each of the bonding pads 120 is arranged right above a respective one of the electrodes 110. The bonding pad 120 is made of a material suitable for wire bonding such as nickel, and has a specific resistance lower than that of the resistor element 100.

In the chip resistor 2A with the above structure, the resistance is lower at each end portion (i.e. the aggregate portion consisting of an electrode 110, a bonding pad 120, and an end region of the resistor element 110 that is sandwiched by the former two components) than when the bonding pad 120 is not provided (see the chip resistor 1A shown in FIG. 10). Accordingly, the above-described disadvantage of the chip resistor 1A can be reduced or practically eliminated in the chip resistor 2A.

However, in the chip resistor 2A shown in FIG. 11, the electrodes 110 are made of copper, while the bonding pads 120 are made of nickel, for example. Thus, two different materials must be prepared for forming the electrodes and the bonding pads. Further, the electrodes 110 and the bonding pads 120, which are made of different materials, must be formed in different process steps. As a result, the product cost of the chip resistor 2A is disadvantageously increased.

DISCLOSURE OF THE INVENTION

The present invention has been proposed under the above-described circumstances. It is therefore an object of the present invention to provide a chip resistor whose resistance difference due to the soldering condition is small and whose product cost can be reduced. Further, it is another object of the present invention to provide a method of making such chip resistor.

A chip resistor according to a first aspect of the present invention comprises: a resistor element including a first surface and a second surface opposite to the first surface; at least two main electrodes spaced from each other and provided on the first surface; and at least two auxiliary electrodes spaced from each other and provided on the second surface. The auxiliary electrodes are arranged to face the main electrodes via the resistor element. The main electrodes and the auxiliary electrodes are made of the same material.

Preferably, the spacing distance between the auxiliary electrodes is no smaller than the spacing distance between the main electrodes.

Preferably, the chip resistor according to the present invention further comprises a first insulating layer and a second insulating layer that are formed on the resistor element. The first insulating layer covers an area between the main electrodes on the first surface of the resistor element, while the second insulating layer covers an area between the auxiliary electrodes on the second surface of the resistor element.

Preferably, the thickness of the first insulating layer is no greater than the thickness of the main electrodes.

Preferably, the chip resistor according to the present invention further comprises at least two solder layers formed on the resistor element. The resistor element includes a pair of end surfaces spaced from each other, and each of the end surfaces is covered by a corresponding one of the two solder layers.

Preferably, the solder layers cover the main electrodes and the auxiliary electrodes in addition to the end surfaces of the resistor element.

Preferably, the chip resistor according to the present invention further comprises a third insulating layer formed on the resistor element. The resistor element includes a side surface extending between the first surface and the second surface. The side surface is covered by the third insulating layer.

A method of making a chip resistor according to a second aspect of the present invention comprises the steps of: preparing a resistor material including a first surface and a second surface opposite to the first surface; forming a pattern of first conductive layer on the first surface; forming a pattern of second conductive layer on the second surface; and dividing the resistor material into a plurality of resistor elements. The first and second conductive layers are made of the same material.

Preferably, the dividing of the resistor material is performed in a manner such that a resulting chip resistor comprises a main electrode made of a part of the first conductive layer and also comprises an auxiliary electrode made of a part of the second conductive layer.

Preferably, the method of making chip resistor according to the present invention further comprises an additional step, performed before the pattern forming of the first conductive layer, for forming a pattern of a first insulating layer on the first surface of the resistor material and also a pattern of a second insulating layer on the second surface of the resistor material. The first conductive layer and the second conductive layer are formed on areas of the resistor material where the first and the second insulating layers are not formed.

Preferably, the pattern forming of the insulating layer is formed by thick-film printing.

Preferably, the first and the second conductive layers are formed by metal plating.

Preferably, the resistor material is divided by punching or by cutting.

Preferably, the method of making a chip resistor according to the present invention further comprises the steps of; forming an insulating layer on a side surface of each resistor element; and forming a solder layer on an end surface of the resistor element by barrel-plating.

BEST MODE FOR CARRYING OUT THE INVENTION

A preferred embodiment of the present invention is described below with reference to the accompanying drawings.

Figure 1:
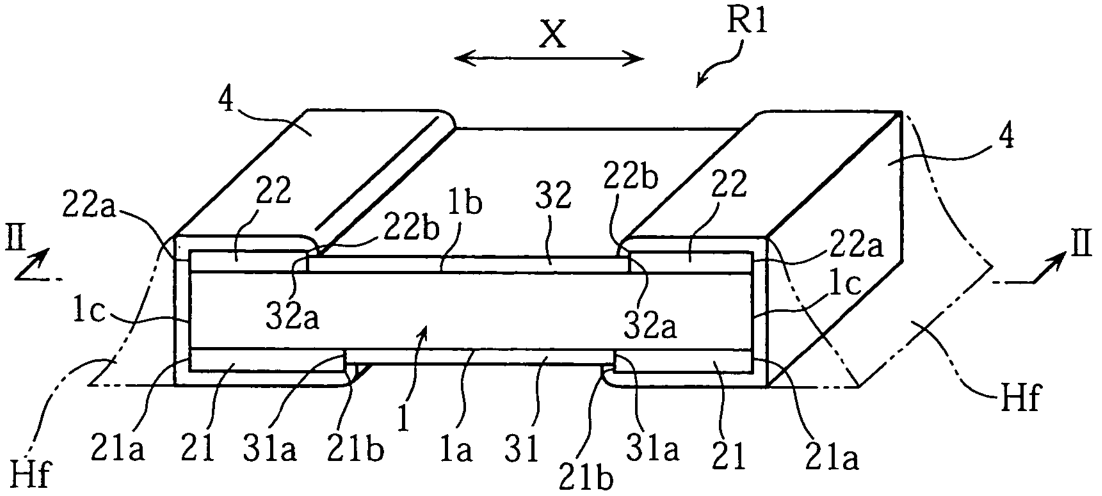
FIG. 1 is a perspective view illustrating a chip resistor according to the present invention.
Figure 2:
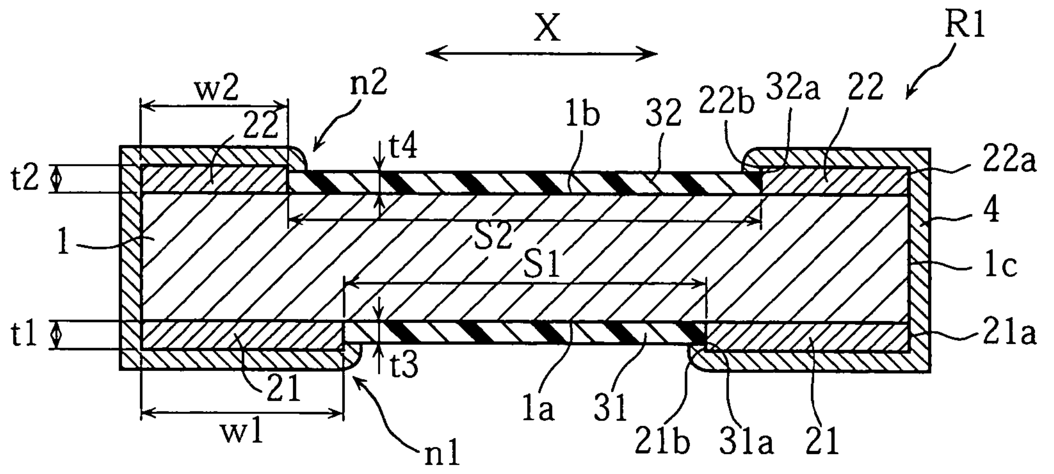
FIG. 2 is a section view taken along lines II-II of FIG. 1.

FIGS. 1 to 2 illustrate a chip resistor according to the present invention. The illustrated chip resistor R1 includes a resistor element 1, a pair of main electrodes 21, a pair of auxiliary electrodes 22, first and second insulating layers 31, 32, and a pair of solder layers 4.

The resistor element 1 is a rectangular chip made of a metal and has a constant thickness. Examples of material for forming the resistor element 1 include Ni—Cu alloy or Cu—Mn alloy, though not limited to these. The material of the resistor element 1 may be selected from materials having a resistivity suited to provide the chip resistor R1 with an intended resistance.

The pair of main electrodes 21 and the pair of auxiliary electrodes are made of a same material such as copper, for example. Each of the main electrodes 21 is formed on a lower surface 1*a* of the resistor element 1, while each of the auxiliary electrodes 22 is formed on an upper surface 1*b* of the resistor element 1. The paired main electrodes 21 are spaced from each other in a direction X shown in the figures, and so are the paired auxiliary electrodes 22. Each main electrode 21 and each auxiliary electrode 22 includes an outside surface 21*a* or 22*a*, which is flush with one of end surfaces 1*c* (the end surfaces spaced from each other in the direction X) of the resistor 1. As shown in FIG. 2, the width w1 of each main electrode 21 is larger than the width w2 of each auxiliary electrode 22, while the spacing S1 between the pair of main electrodes 21 is smaller than the spacing S2 between the pair of auxiliary electrodes 22.

The first and second insulating layers 31, 32 are all made of a resin such as epoxy resin. The first insulating layer 31 is formed on the lower surface 1*a* of the resistor element 1, at an area between the main electrodes 21. In a similar way, the second insulating layer 32 is formed on the upper surface 1*b* of the resistor element 1, at an area between the auxiliary electrodes 22. A pair of side ends 31*a* of the first insulating layer 31 are spaced in the direction X, each contacting with an inside surface 21*b* of respective main electrode 21. Similarly, a pair of side ends 32*a* of the second insulating layer 32 are spaced in the direction X, each touching an inside surface 22*b* of respective auxiliary electrode 22. Thus, the spacing S1 between the pair of main electrodes 21 is equal to the width of the first insulating layer 31, and the spacing S2 between the pair of auxiliary electrodes 22 is equal to the width of the second insulating layer 32. The thickness t3 of the first insulating layer 31 is smaller than the thickness t1 of the main electrodes 21, and the thickness t4 of the second insulating layer 32 is smaller than the thickness t2 of the auxiliary electrodes 22. However, this is not limitative for the present invention, but the thickness t3 and t1 may be the same, and the thickness t4 and t2 may also be the same.

As can be seen from FIGS. 1 and 2, each of the solder layers 4 includes a bottom portion (covering the main electrode 21), a top portion (covering the auxiliary electrode 22), and a side portion connecting the bottom and the top portions. The side portion covers the end surface 1*c* of the resistor 1. The solder layer 4 is formed through plating, as described below. Thus, as indicated by reference signs n1, n2 in FIG. 2, the solder layer 4 is elongated over a part of each of the first and second insulating layers 31, 32. Similarly to the solder layer 4, the main electrodes 21 and the auxiliary electrodes 22 are also formed through plating. Thus, though not shown, the main electrodes 21 and the auxiliary electrodes 22 actually overlap respective one of the first insulating layer 31 and the second insulating layer 32.

The resistor element 1 has a thickness of about 0.1 mm-1.0 mm. Each of the main electrodes 21 and the auxiliary electrodes 22 has a thickness of about 30 μm-200 μm. Each of the first and second insulating layers 31, 32 has a thickness of about 20 μm. The solder layer 4 has a thickness of about 5 μm. Each of the length and the width of the resistor element 1 may be about 2 mm-7 mm. Of course, these dimensions are only exemplary. For example, dimensions of the resistor element 1 may be decided according to an intended resistance. The chip resistor R1 is intended to have a low resistance (e.g. about 0.5 mΩ-100 mΩ).

The above-described chip resistor R1 may be made by a method shown in FIGS. 3-5.

Figure 3A:
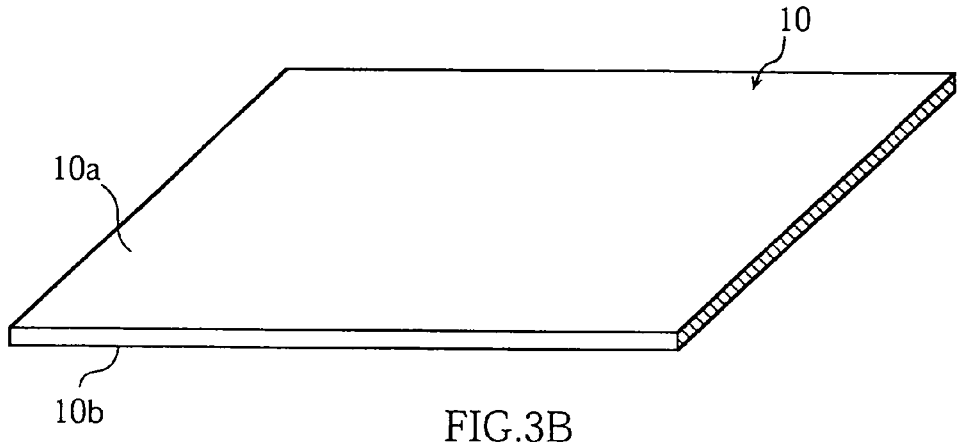
FIGS. 3A-3C are views illustrating process steps of a method of making the chip resistor.

First, as shown in FIG. 3A, a metal plate 10 is prepared for making the resistor 1. The plate 10 has dimensions (length multiplied by width) large enough to make a plurality of the resistors 1, and also has a constant thickness as a whole. The plate 10 includes a first surface 10*a* and a second surface 10*b* opposite to the first surface.

Figure 3B:
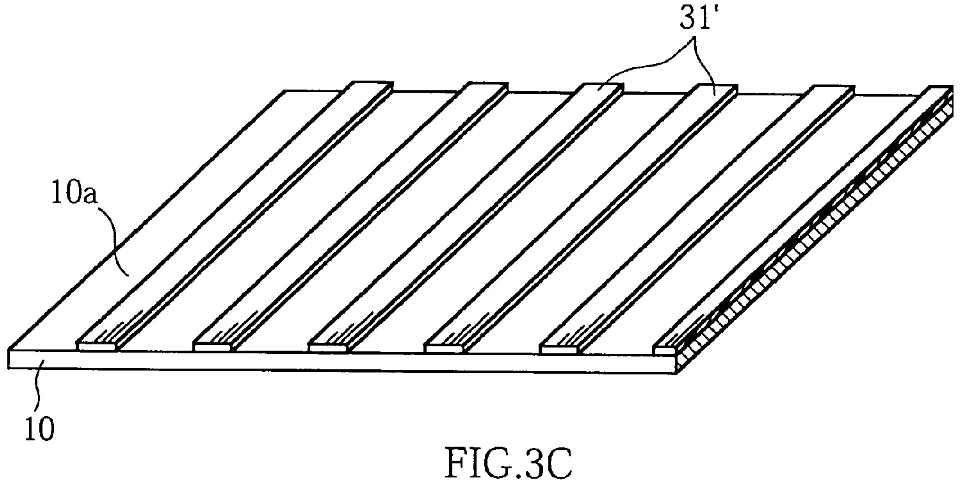

As shown in FIG. 3B, a plurality of strip-shaped insulating layers 31' are formed on the first surface 10*a* of the plate 10. The insulating layers 31' are elongated in parallel to each other, and spaced from each other at a predetermined distance. The insulating layer 31' may be formed by thick-film printing using e.g. epoxy resin.

Figure 3C:
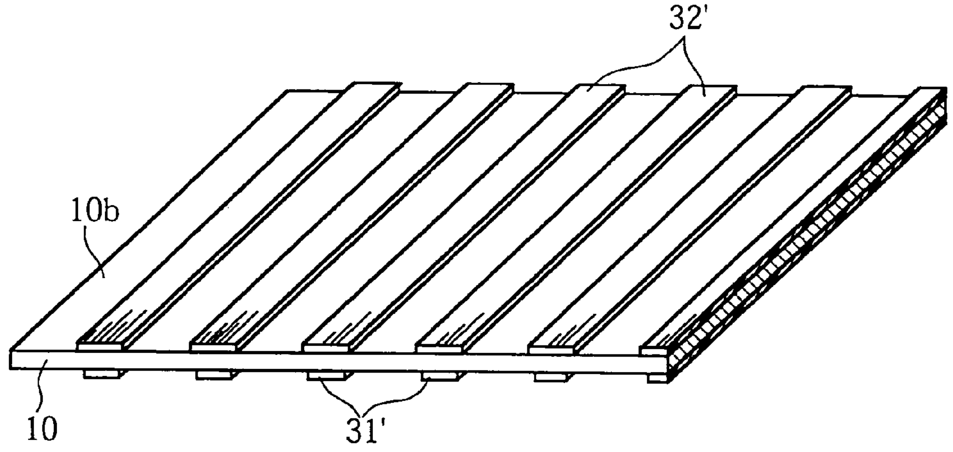

As shown in FIG. 3C, a plurality of strip-shaped insulating layers 32' is formed on the second surface 10*b* of the plate 10. The insulating layers 32' are elongated in parallel to each other, and spaced from each other at a predetermined distance. Preferably, similarly to the above-described insulating layer 31', the formation of the insulating layer 32' may be formed by thick-film printing using epoxy resin. By the same method using the same resin, the product cost can be reduced by forming the insulating layers 31', 32'. Further, by the thick-film printing, the width and the thickness of each insulating layers 31', 32' can be accurately formed in predetermined dimensions. As shown in the figure, each of the insulating layers 32' is vertically formed and positioned relative to a respective one of the insulating layer 31', and the width of the insulating layer 32' is larger than the width of the insulating layer 31'.

Figure 4A:
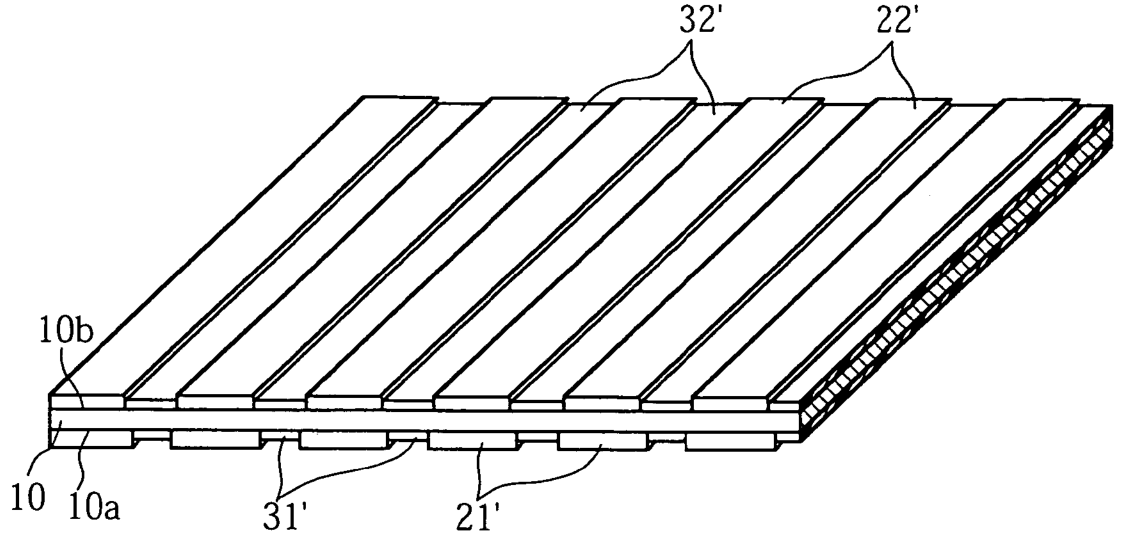
FIGS. 4A-4B are views illustrating process steps following the process step shown in FIG. 3C.

As shown in FIG. 4A, on the first surface 10*a*, first conductive layers 21' are further formed between the insulating layers 31'. At the same time, on the second surface 10*b*, second conductive layers 22' are formed between the insulating layers 32'. The conductive layers 21', 22' are formed by e.g. copper-plating. The conductive layers 21' are to serve as the main electrodes 21, and the conductive layers 22' are to serve as the auxiliary electrodes 22.

Due to the plating process, a plurality of conductive layers each having constant thickness can be formed simultaneously and easily. Further, the plating process enables the formation of the conductive layers without causing spaces between the conductive layers and the insulating layers.

Figure 4B:
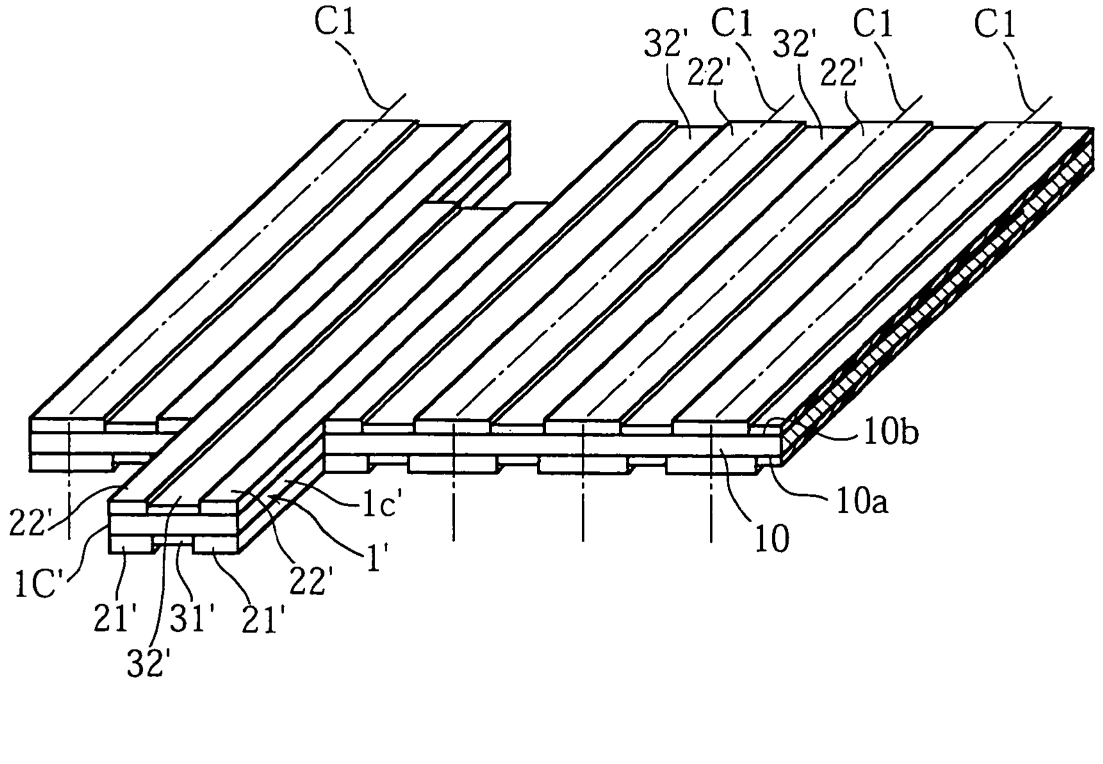

As shown in FIG. 4B, after the conductive layers 21', 22 are formed, the plate 10 (and the conductive layers 21', 22 formed thereon) is cut along imaginary lines C1. Each of the cutting lines is located at such a position as to halve a respective one of the conductive layers 21', 22' widthwise thereof. This cutting process divides the plate 10 into a plurality of bar-shaped resistor material bodies 1'. Each of the resistor material bodies 1' includes a pair of side surfaces 1*c*' which are the cut surfaces elongated lengthwise of the resistor material.

Figure 5A:
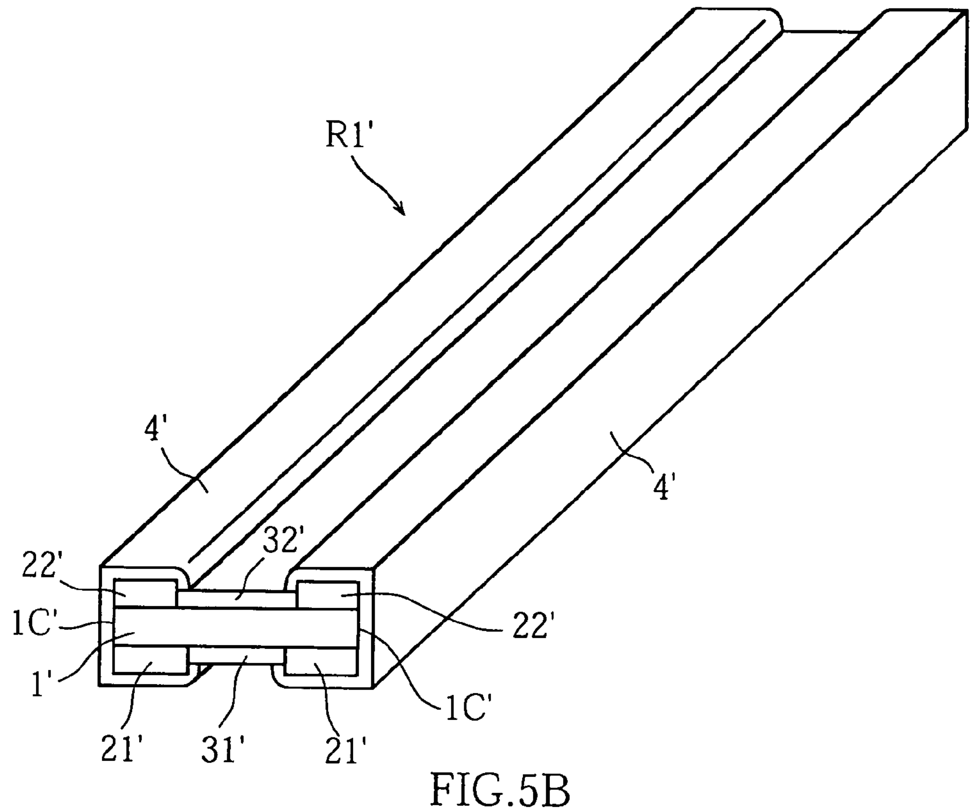
FIGS. 5A-5B are views illustrating process steps following the process step shown in FIG. 4B.

As shown in FIG. 5A, the side surfaces 1*c*' of the resistor material bodies 1' and the conductive layers 21', 22' are covered by solder layers 4'. Here, a bar-shaped resistor aggregate R1' is obtained. The solder layer 4' is formed through plating, for example.

Figure 5B:
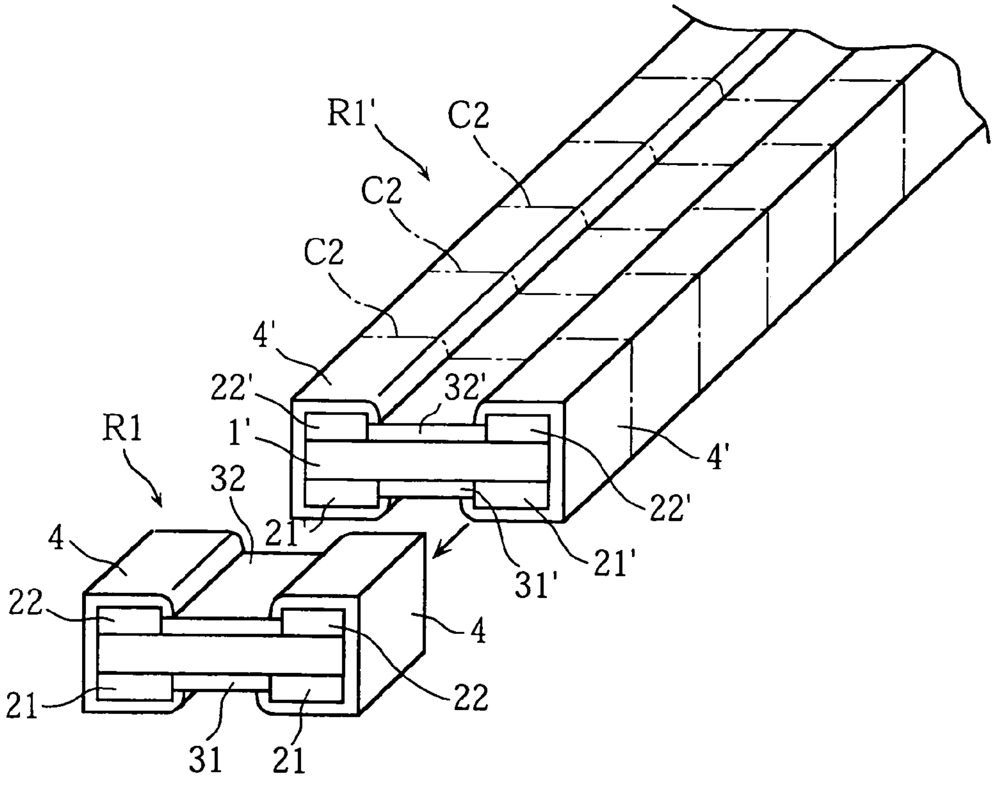

As shown in FIG. 5B, the resistor aggregate R1' is cut along imaginary lines C2. Each of the cutting lines is spaced from each other at a predetermined distance in length of the resistor aggregate R1'. This cutting process divides the resistor aggregate R1' into a plurality of the chip resistor R1.

The chip resistor R1 made in above-described method may be surface-mounted on a circuit board (or another target mount) by reflow soldering, for example. Specifically, In reflow soldering, a solder paste is applied onto terminals of the circuit board. Thereafter, the chip resistor R1 are placed on the circuit board so that the main electrodes 21 contact with the solder paste. In this state, the circuit board and the chip resistor R1 are heated in a reflow furnace. Finally, the chip resistor R1 is fixed to the circuit board upon cooling for solidification of melted solder.

The solder layers 4 are melted during the reflow soldering. The solder layers 4 are formed on the end surfaces 1*c* of the resistor element 1 as well as on the surfaces of the main electrodes 21 and auxiliary electrodes 22. Thus, the melted solder forms solder fillets Hf, as indicated by imaginary lines in FIG. 1. The state (e.g. shape) of the solder fillets Hf may be checked from outside for determining whether the mounting of the chip resistor R1 is appropriate. The solder fillets Hf facilitate reliable mounting of the chip resistor R1 on the circuit board. Further, the solder fillets Hf radiate the heat caused at the chip resistor R1, and thus regulate a temperature rise of the chip resistor R1. In order to form such solder fillets Hf, each of the solder layers preferably includes the bottom portion (covering the main electrode 21), the side portion (covering the side end 1*c* of the resistor element 1), and the top portion (covering the auxiliary electrode 22), though this is not limitative on the present invention. For example, the solder layer 4 may include at least the portion covering the side end 1*c* of the resistor element 1. Preferably, the bottom, side, and top portions of the solder layer 4 are integrated, though the three portions may be separated from each other.

In surface-mounting of the chip resistor R1, the melted solder may flow apart from the main electrodes 21 and auxiliary electrodes 22. The insulating layers 31, 32 are formed on a "non-electrode area" (where the main electrode 21 and the auxiliary electrode 22 are not formed) of the lower surface 1*a* and the upper surface 1*b* of the resistor element 1. Due to this structure, the melted solder is prevented from directly sticking to the resistor element 1.

In order for the chip resistor R1 to have an intended resistance (resistance between the pair of main electrodes 21), it is necessary to accurately set the spacing S1 between the pair of main electrodes 21 at a predetermined value. In this regard, the spacing S1 between the pair of main electrodes 21 is determined by the first insulating layer 31 whose size can be accurately set by thick-film printing. Thus, it is possible to accurately set the spacing S1 at a predetermined value.

Figure 10:
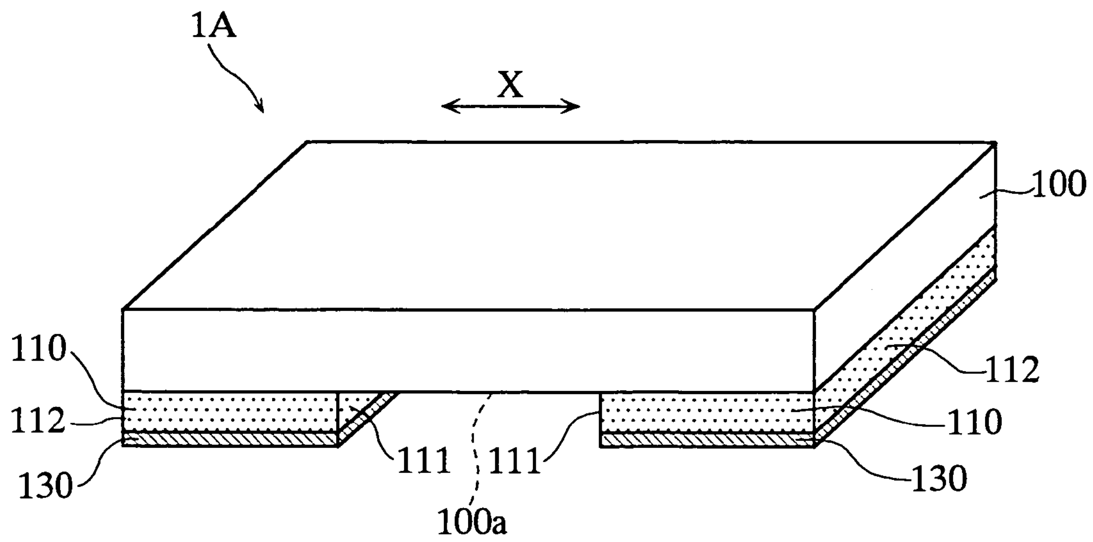
FIG.10 PRIOR ART
FIG. 10 is a perspective view illustrating an example of a conventional chip resistor.
Figure 11:
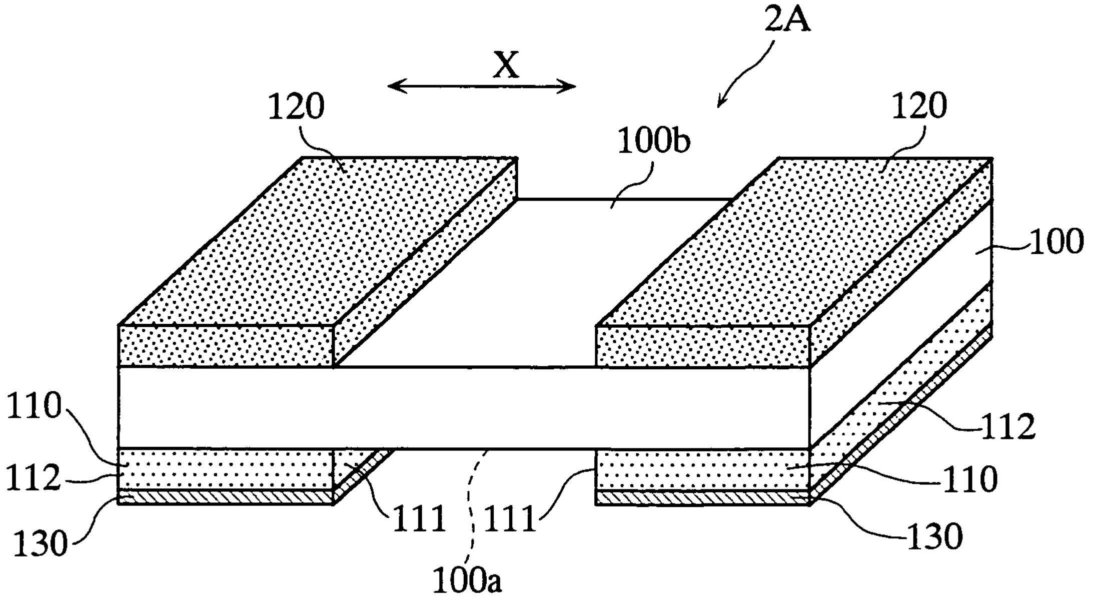
FIG.11 PRIOR ART
FIG. 11 is a perspective view illustrating another example of a conventional chip resistor.

Each of the auxiliary electrodes 22 made of copper has a high electric conductivity equal to that of the main electrodes 21. The auxiliary electrode 22 has a specific resistance lower than that of the resistor element 1. Thus, the electric resistance is lower, at an area including the main electrodes 21, the auxiliary electrodes 22, and a portion of the resistor element 1 sandwiched by the electrodes, than the electric resistance at a resistor element which is not provided with the auxiliary electrode 22 (see FIG. 10). This results in reduction of a difference between the resistance values in cases where the solder contacts with the under surfaces of the main electrodes 21*a* only at a portion adjacent to each inside surface 21*b*, and where the solder contacts with the under surfaces of the main electrodes 21*a* only at a portion adjacent to each outside surface 21*a*.

The spacing S2 between the auxiliary electrodes 22 is larger than the spacing S1 between the main electrodes 21. Thus, the resistance between the auxiliary electrodes 22 is larger than the resistance between the main electrodes 21. Therefore, the resistance between the auxiliary electrodes 22 does not cause drop of the resistance of the chip resistor R1 to below the desired resistance value.

Each of the main electrodes 21 and the auxiliary electrodes 22 partially overlaps a respective one of the side ends 31*a*, 32*a* of the first and second insulating layers 31, 32. Therefore, the side ends 31*a*, 32*a* are prevented from easily coming off the resistor element 1.

The present invention is not limited to the above-described embodiment. The specific components of the chip resistor according to the present invention may be modified in various ways. Similarly, the specific process steps of the method of making the chip resistor according to the present invention may be modified in various ways.

Figure 6:
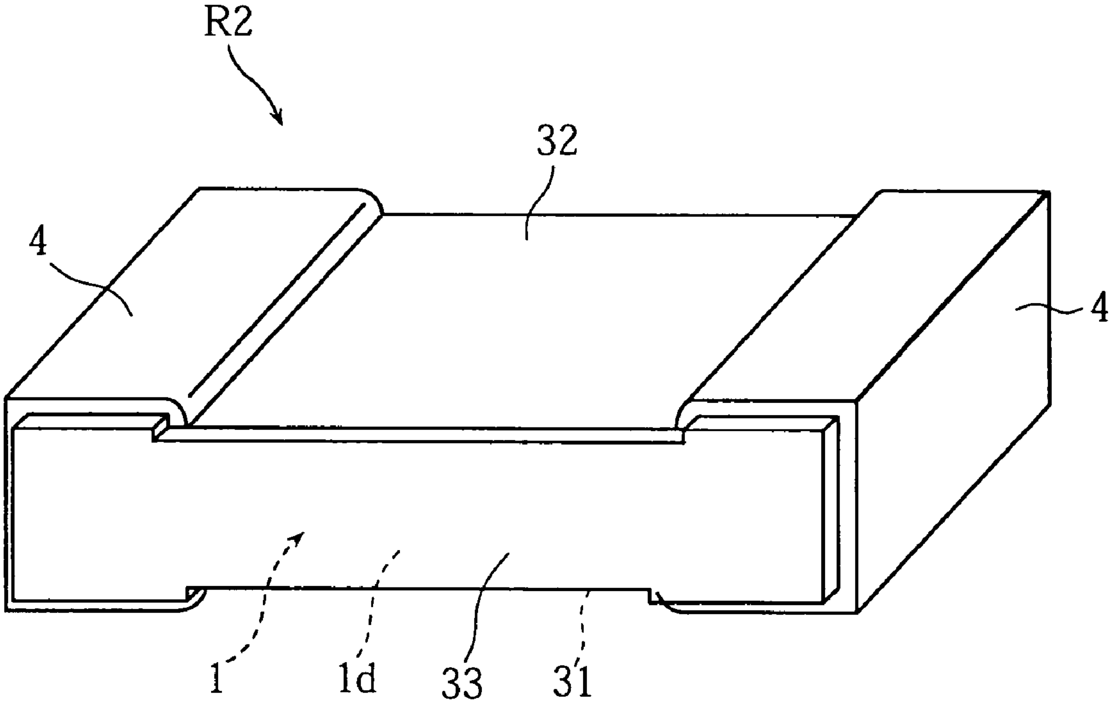
FIG. 6 is a perspective view illustrating a modified example of the chip resistor shown in FIG. 1.

For example, the chip resistor according to the present invention may be designed as shown in FIG. 6. In FIG. 6 and the following figures, elements identical to or similar to those in the above-described embodiment are given the same reference numbers.

The chip resistor R2 shown in FIG. 6 is provided with a pair of third insulating layers 33 covering a pair of side surfaces 1*d* of the resistor element 1. Due to this structure, the solder is prevented from sticking to the side surfaces 1*d* of the resistor element 1.

Figure 7A:
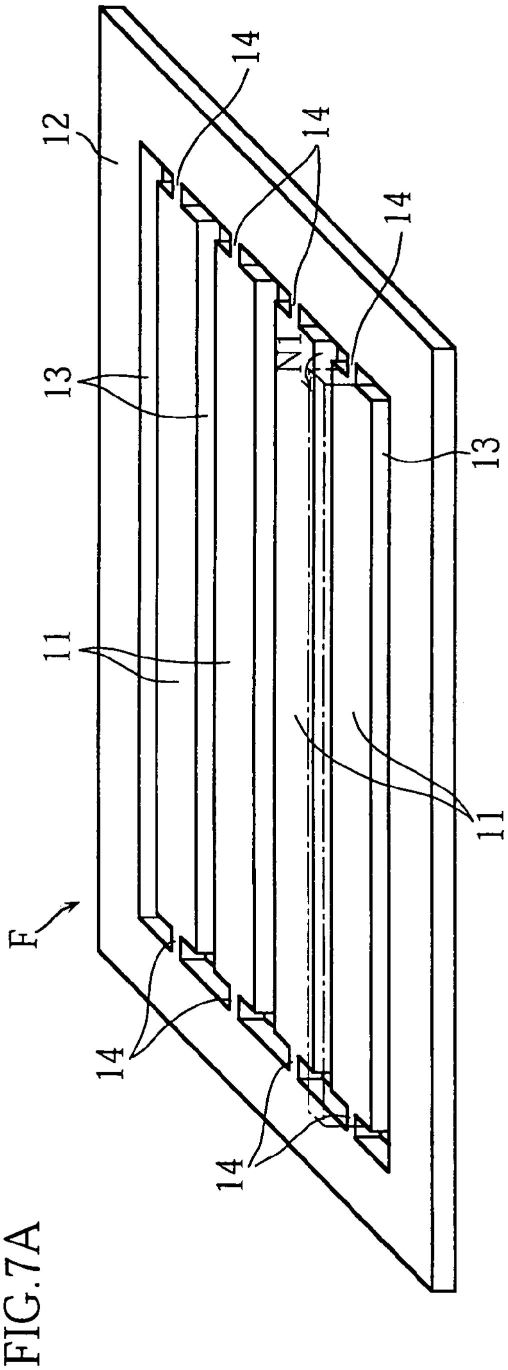
FIG. 7A is a perspective view illustrating an example of a frame for making the chip resistor according to the present invention.
Figure 7B:
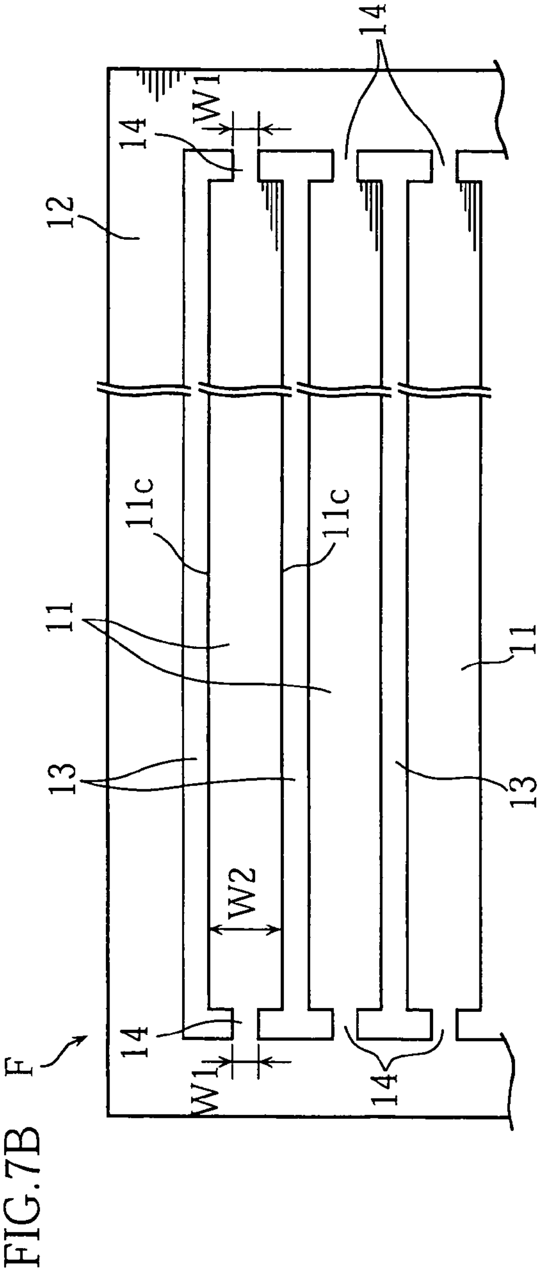
FIG. 7B is a plan view illustrating a principal part of the frame.

As shown in FIGS. 7A and 7B, a frame F may be used to make chip resistor. The frame F is formed by punching a flat metal plate, for example. The frame F includes a plurality of strips 11 elongated in a predetermined direction and a rectangular supporting portion 12 for supporting the plurality of strips 11. Each of the strips 11 is flanked by slits 13. The strip 11 is connected to the supporting portion 12 via connecting portions 14 having width W1 smaller than the width W2 of each strip 11. Due to this structure, the connecting portions 14 are twisted to rotate the strip 11 through 90 degrees in an arrow N1 direction, to facilitate process steps where solder layers 4' or third insulating layers 33' are formed on side surfaces 11*c* of the strip 11, as described later.

Figure 8A:
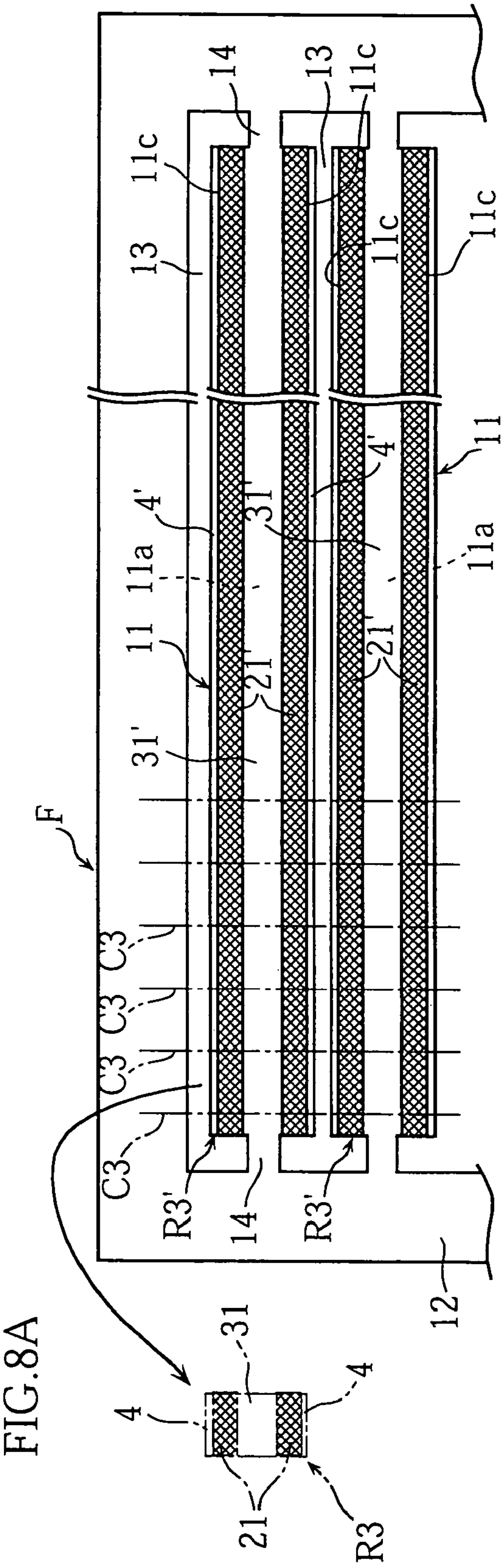
FIGS. 8A-8B are views illustrating an example of production method utilizing the frame.
Figure 8B:
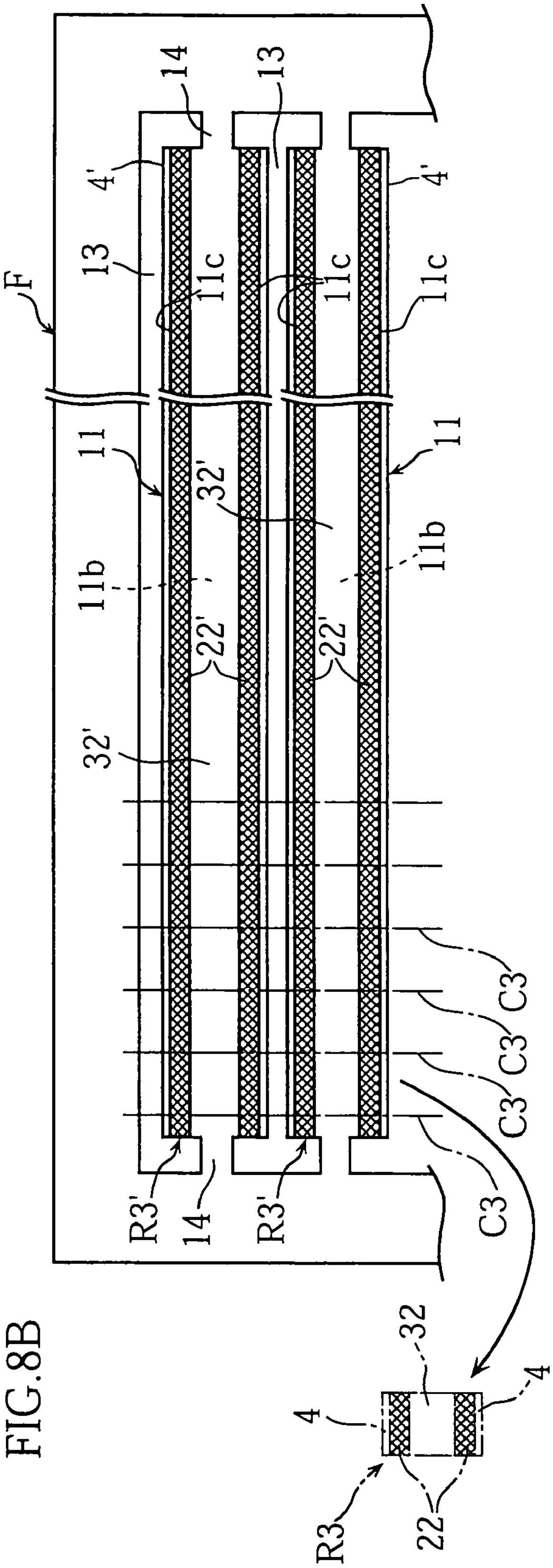

As shown in FIGS. 8A and 8B, a first surface 11*a* of each strip 11 of the frame F is formed with a strip-shaped first insulating layer 31' sandwiched by two rows of strip-shaped conductive layers 21'. Similarly, a second surface 11*b* opposite to the first surface 11*a* of each strip 11 is formed with a strip-shaped insulating layer 32' sandwiched by two rows of strip-shaped conductive layers 22' (the conductive layers 21', 22' are represented by crisscross hatching in FIGS. 8A and 8B, as well as in FIG. 9). Next, a pair of side surfaces 11*c* of the strip 11 are formed with solder layers 4'. The solder layers 4' may be formed to cover the surface of the conductive layers 21', 22. Through the process steps as described above, a bar-shaped resistor aggregate R3' is made. Then, the resistor aggregate R3' is cut along imaginary lines C3 to make a plurality of chip resistors R3. Each of the chip resistors R3 has a similar structure as the chip resistor R1 illustrated in FIGS. 1 and 2.

Figures 9A, 9B:
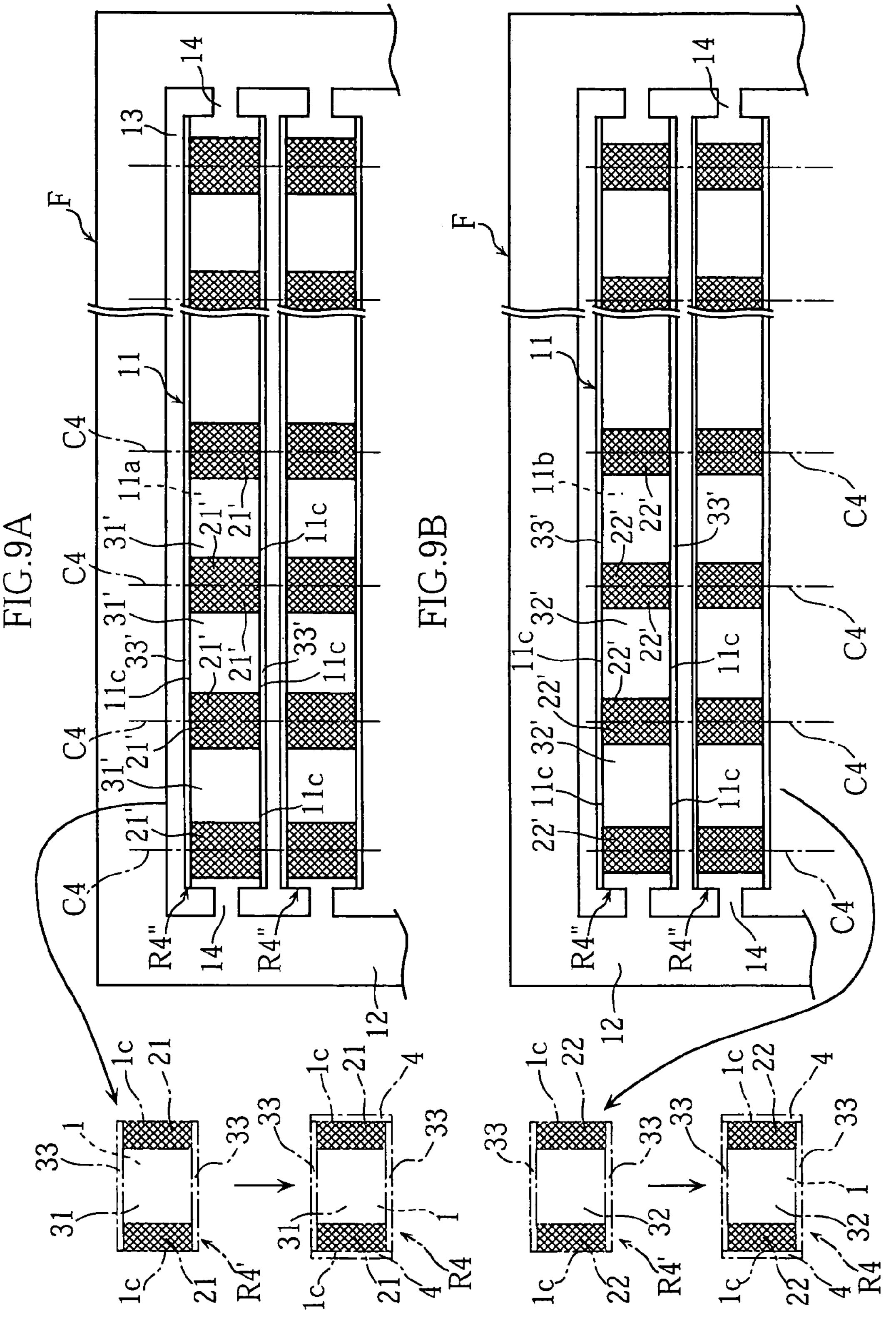
FIGS. 9A-9B are views illustrating another example of production method utilizing the frame.

Differing from the above methods, the chip resistor may be made by a method illustrated in FIG. 9. Specifically, the first surface 11*a* of each strip 11 of the frame F is provided with alternating formations of rectangular insulating layers 31' and conductive layers 21'. Similarly, the second surface 11*b* opposite to the first surface 11*a* is provided with alternating formations of rectangular insulating layers 32' and conductive layers 22'. Next, the pair of side surfaces 11*c* of the strip 11 are formed with insulating layers 33'. Through such process steps, a bar-shaped resistor aggregate R4" is made. Then, the resistor aggregate R4" is cut along imaginary lines C4 to make a plurality of chip resistors R4' which are not provided with the solder layers. Thereafter, a pair of end surfaces 1*c* of the resistor element 1 of the chip resistor R4' are plated with solder. In this way, a chip resistor R4 is made to have a structure similar to the chip resistor R2 shown in FIG. 6.

The solder layer 4 may be formed by barrel-plating, for example. After the forming process of the plurality of chip resistors R4', the chip resistors R4' are placed all together in a single barrel to be plated with solder. Each chip resistor R4' has the end surfaces 1*c* of the resistor element 1, the surfaces of main electrodes 21 and the surfaces of auxiliary electrodes 22 as exposed metallic surfaces. On the other hand, the other surfaces are covered by the first to third insulating layers 31-33, whereby the solder layers 4 are appropriately formed over the above-described metallic surfaces. Thus, the chip resistor R4 can be made efficiently.

In the present invention, a plurality of chip resistors are made of one plate. In the above-described embodiments, the plate is divided into the plurality of chip resistors by cutting. However, the plate may be divided into the plurality of chip resistors by punching, for example.

In the present invention, the pairs of electrodes may be formed on one surface of the resistor element. In this case, one pair of electrodes may be used to detect an electric current while the other pair of electrodes may be used for voltage detection. Further, the spacing between the main electrodes may be equal to the spacing between the auxiliary electrodes.

The present invention being thus described, it is obvious that the same may be modified in various ways. Such modifications should not be regarded as a departure from the spirit and scope of the invention, and all such modifications as would be obvious to those skilled in the art are intended to be included in the scope of the appended claims.

The invention claimed is:

1. A chip resistor comprising:

A metal resistor element including a first surface and a second surface opposite to the first surface;

at least two main electrodes spaced from each other and provided on the first surface; and at least two auxiliary electrodes spaced from each other and provided on the second surface, the auxiliary electrodes facing the main electrodes via the resistor element;

a first insulating layer formed on the resistor element for covering only an area between the main electrodes on the first surface of the resistor element; and a second insulating layer formed on the resistor element for covering only an area between the auxiliary electrodes on the second surface of the resistor element;

wherein the main electrodes and the auxiliary electrodes are made of a same material.

2. The chip resistor according to claim 1, wherein a spacing distance between the auxiliary electrodes is no smaller than a spacing distance between the main electrodes.

3. The chip resistor according to claim 1, wherein a thickness of the first insulating layer is no greater than a thickness of the main electrodes.

4. The chip resistor according to claim 1, further comprising at least two solder layers formed on the resistor element, wherein the resistor element includes a pair of end surfaces spaced from each other, each of the end surfaces being covered by a corresponding one of the two solder layers.

5. The chip resistor according to claim 1, further comprising a third insulating layer formed on the resistor element, wherein the resistor element includes a side surface extending between the first surface and the second surface, the side surface being covered by the third insulating layer.

6. The chip resistor according to claim 4, the solder layers cover the main electrodes and the auxiliary electrodes in addition to the end surfaces of the resistor element.

7. A method of making a chip resistor, the method comprising the steps of:

preparing a metal resistor material including a first surface and a second surface opposite to the first surface;

forming a pattern of first insulating layer on the first surface;

forming a pattern of second insulating layer on the second surface;

forming a pattern of first conductive layer on the first surface for covering portions of the first surface which are not covered with the pattern of insulating layer;

forming a pattern of second conductive layer on the second surfaces for covering portions of the second surface which are not covered with the pattern of insulating layer; and dividing the resistor material into a plurality of resistor elements;

wherein the first conductive layer and the second conductive layer are made of a same material.

8. The method of making chip resistor according to claim 7, wherein the dividing of the resistor material is performed in a manner such that a resulting chip resistor comprises a main electrode made of a part of the first conductive layer and an auxiliary electrode made of a part of the second conductive layer.

9. The method of making chip resistor according to claim 7, wherein the pattern forming of the first and second insulating layers is formed by thick-film printing.

10. The method of making chip resistor according to claim 7, wherein the first conductive layer and the second conductive layer are formed by metal plating.

11. The method of making chip resistor according to claim 7, wherein the resistor material is divided by punching or by cutting.

12. The method of making a chip resistor according to claim 7, further comprising the steps of: forming an insulating layer on a side surface of each resistor element; and forming a solder layer on an end surface of the resistor element by barrel-plating.

* * * * *